United States Patent
Cai et al.

(10) Patent No.: US 12,338,522 B2
(45) Date of Patent: Jun. 24, 2025

(54) FINE METAL MASK PLATE, MASK DEVICE AND TENSIONING EQUIPMENT

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jianchang Cai, Beijing (CN); Longhui Xue, Beijing (CN); Wei Zhang, Beijing (CN); Xingliang Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 776 days.

(21) Appl. No.: 17/309,104

(22) PCT Filed: Sep. 18, 2020

(86) PCT No.: PCT/CN2020/116159
§ 371 (c)(1),
(2) Date: Apr. 23, 2021

(87) PCT Pub. No.: WO2021/082791
PCT Pub. Date: May 6, 2021

(65) Prior Publication Data
US 2022/0307120 A1   Sep. 29, 2022

(30) Foreign Application Priority Data
Oct. 30, 2019 (CN) .......................... 201921843623.X (51) Int. Cl.
C23C 14/04 (2006.01)
C23C 14/24 (2006.01)

(52) U.S. Cl.
CPC ............ *C23C 14/042* (2013.01); *C23C 14/24* (2013.01)

(58) Field of Classification Search
None
See application file for complete search history.

(56) References Cited

U.S. PATENT DOCUMENTS 9,837,608 B2    12/2017  Moon et al.
2004/0115342 A1*  6/2004  Shigemura ............. H10K 71/13
                                                            101/112
(Continued)

FOREIGN PATENT DOCUMENTS

CN   103695840 A   4/2014
CN   206512267 U   9/2017
(Continued)

OTHER PUBLICATIONS

China National Intellectual Property Administratin (ISA/CN), International Search Report and Written Opinion for International Application No. PCT/CN2020/116159, dated Dec. 3, 2020.

*Primary Examiner* — Charles Capozzi
(74) *Attorney, Agent, or Firm* — BROOKS KUSHMAN P.C.

(57) ABSTRACT

A fine metal mask plate, a mask device and a tensioning device are provided in the present disclosure. The fine metal mask plate includes a mask strip body being of strip-like shape and including two opposite long edges and two opposite short edges, and at least three skirts arranged on each short edge and spaced apart from each other along an extension direction of the short edge.

14 Claims, 2 Drawing Sheets

(56) References Cited

U.S. PATENT DOCUMENTS

| | | | | |
|---|---|---|---|---|
| 2017/0250208 A1* | 8/2017 | Kim | ........................ | H10K 59/12 |
| 2018/0239241 A1* | 8/2018 | Lv | .............................. | G03F 7/12 |
| 2019/0378984 A1* | 12/2019 | Nakamura | ................ | C23F 1/02 |
| 2020/0181754 A1* | 6/2020 | Ye | ......................... | C23C 14/042 |
| 2021/0054494 A1 | 2/2021 | Ding et al. | | |
| 2021/0060700 A1* | 3/2021 | Okamoto | ............... | B23K 26/21 |

FOREIGN PATENT DOCUMENTS

| | | |
|---|---|---|
| CN | 208604193 U | 3/2019 |
| CN | 110117768 A | 8/2019 |
| CN | 110373630 A | 10/2019 |
| CN | 211036074 U | 7/2020 |
| JP | 2018095958 A | 6/2018 |

* cited by examiner

FINE METAL MASK PLATE, MASK DEVICE AND TENSIONING EQUIPMENT

CROSS-REFERENCE TO RELATED APPLICATIONS

This application is the U.S. national phase of PCT Application No. PCT/CN2020/116159 filed on Sep. 18, 2020, which claims priority to Chinese Patent Application No. 201921843623.X, filed on Oct. 30, 2019, which are incorporated herein by reference in their entireties.

TECHNICAL FIELD

The disclosure relates to the field of mask evaporation technologies, in particular to a fine metal mask plate, a mask device and a tensioning device.

BACKGROUND

In a process for manufacturing a display panel, a core of an evaporation technology is to design and manufacture a Fine Metal Mask (FMM). During an evaporation process, a plurality of fine metal mask plates in a tensioned and stretched state are welded onto a frame, so as to form a mask frame assembly. The mask frame assembly is placed and used in an evaporation machine. Such problems as prone to wrinkling, large sagging amount, reduced tensioning precision may occur in the fine mask plate during a tensioning process.

SUMMARY

A display device includes a plurality of pixel units arranged in an array form, and each pixel unit includes a red sub-pixel unit, a green sub-pixel unit and a blue sub-pixel unit (R, G, B sub-pixel units for short). Taking an OLED display device as an example, any sub-pixel unit specifically includes an anode layer, a hole transporting layer, a light-emitting layer capable of emitting red/green/blue light, an electron transporting layer and a cathode layer. when each sub-pixel unit is formed, a mask plate technology is adopted, the sub-pixel units of two colors in the R, G, B sub-pixel units are shielded by the shielding effect of a mask area on the mask plate, and then a film-forming material is deposited on a corresponding non-shielded color sub-pixel unit through a pattern area of the mask plate by the means of evaporation or ink-jet printing, so as to form a corresponding pattern.

A fine metal mask plate is provided in the embodiment of the present disclosure. The fine metal mask plate includes a mask strip body being of a strip-like shape and including two opposite long edges and two opposite short edges; and at least three skirts arranged on each short edge and spaced apart from each other along an extension direction of the short edge.

For example, the mask strip body includes welding areas close to the short edges, each welding area is provided with a plurality of rows of welding spots, and an arrangement direction of each row of welding spots is an extension direction of each long edge.

For example, the welding area is provided with 2 to 5 rows of welding spots.

For example, a width of the mask strip body in the extension direction of the short edge ranges from 100 mm to 400 mm.

For example, the number of the skirts on each short edge is three; a width of each skirt in the extension direction of the short edge ranges from 10 mm to 80 mm, and the widths of the skirts in the extension direction of the short edge are the same.

For example, a spacing between two adjacent skirts in the extension direction of the short edge ranges from 20 mm to 80 mm, and the spacings between any two adjacent skirts in the extension direction of the short edge are the same.

For example, a spacing between two adjacent rows of welding spots in the extension direction of the short edge ranges from 1 mm to 5 mm, and a spacing between two adjacent welding spots in a same row in the extension direction of the long edge ranges from 1 mm to 5 mm.

For example, the at least three skirts on each short edge of the mask strip body include two end-part skirts arranged at end-part positions of the short edge, and a middle skirt arranged between the two end-part skirts. Each skirt includes a first side edge, a second side edge, a third side edge and a fourth side edge. The first side edge and the second side edge are arranged opposite to each other, extension directions of the first side edge and the second side edge are parallel to the extension direction of the short edge, and the first side edge is connected to the short edge of the mask strip body. The third side edge and the fourth side edge are arranged opposite to each other and located between the first side edge and the second side edge. the third side edge of one end-part skirt of the two end-part skirts is of a straight-line-like shape parallel to the extension direction of the long edge and coincides with the long edge on one side where the one end-part skirt is located, the fourth side edge of the one end-part skirt is of an arc-like shape at one end close to the first side edge, and is of a straight-line-like shape parallel to the extension direction of the long edge at one end close to the second side edge. The fourth side edge of the other end-part skirt is of a straight-line-like shape parallel to the extension direction of the long edge and coincides with the long edge on one side where the other end-part skirt is located, the third side edge of the other end-part skirt is of an arc-like shape at one end close to the first side edge, and is of a straight-line-like shape parallel to the extension direction of the long edge at one end close to the second side edge. The third side edge and the fourth side edge of the middle skirt are each of an arc-like shape at one end close to the first side edge, and are each of a straight-line-like shape parallel to the extension direction of the long edge at one end close to the second side edge.

For example, shapes of the third side edge and the fourth side edge of the middle skirt are symmetrical about a central line of the middle skirt in the extension direction of the long edge, and, an overall shape of the middle skirt and the two end-part skirts among the at least three skirts on each short edge are symmetrical about a center line of the mask strip body in the extension direction of the long edge.

For example, the mask strip body includes an opening evaporation area and the welding areas, the opening evaporation area is located in a middle area of the mask strip body, the welding areas are located at two opposite ends of the opening evaporation area and close to the short edges, the opening evaporation area is provided with a plurality of sub-areas, and a plurality of openings arranged in an array form are provided in each sub-area.

For example, the at least three skirts on each short edge of the mask strip body include two tensioning skirts arranged at the end-part positions of the short edge, and a supporting skirt located between the two tensioning skirts.

For example, a space between the supporting skirt and each tensioning skirt is of a U-like shape.

A mask device is further provided, including: a plurality of above-mentioned fine metal mask plates, a supporting frame and a mask plate frame including a first frame and a second frame arranged opposite to each other, and a third frame and a fourth frame arranged opposite to each other. The plurality of fine metal mask plates are arranged one after another along an extension direction of the first frame, the two short edges of each fine metal mask plate are fixed onto the first frame and the second frame respectively, and the supporting frame is fixed onto the mask plate frame and arranged at one side of the fine metal mask plate.

A tensioning device for fixing the above-mentioned fine metal mask plate onto a mask plate frame is further provided, including: two clamps configured to clamp the two short edges of the mask strip body respectively, where each clamp includes at least three grippers, each gripper is configured to correspond to one of the skirts on the short edge and capable of engaging the corresponding skirt, the at least three skirts on each short edge of the mask strip body include two end-part skirts arranged at the end-part positions of the short edge and a middle skirt located between the two end-part skirts, and the at least three grippers of each clamp include end-part grippers corresponding to the end skirts and a middle gripper corresponding to the middle skirt; and a tension control mechanism configured to control the clamp to apply a tensioning force to the mask strip body.

For example, each gripper comprises an upper engagement part and a lower engagement part, a clamping distance between the upper engagement part and the lower engagement part in a thickness direction of the mask strip body and for accommodating the corresponding skirt is provided, and the gripper is provided with an adjustment structure configured to adjust the clamping distance. The clamping distance in the middle gripper is larger than that in each end-part gripper, and the clamping distance in the end-part gripper is smaller than or equal to a thickness of the end-part skirt, so as to engage the end-part skirt. The clamping distance in the middle gripper is larger than a thickness of the middle skirt, so that the middle gripper is not engaged with the middle skirt.

For example, the tension control mechanism includes: a tension applying structure connected to the grippers and configured to control the end-part gripper to apply a tensioning force to the end-part skirt, a detector configured to acquire an offset between a current position of the fine metal mask plate and a target position, and a controller configured to adjust the tensioning force applied to the end-part skirt by the end-part gripper in accordance with the offset.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before a detailed description is given about a fine metal mask plate, an evaporation device and a tensioning device of the present disclosure, it is necessary to provide the following description.

In the art, a person skilled in the art may use other names to refer to the fine metal mask plate and components thereof in a fine metal mask process. For example, the fine metal mask plate (FMM) may also be referred to as a mask strip or a mask sheet (FMM sheet), and a plurality of mask strips or FMM sheets are welded onto a frame. In the following embodiments, only different names are adopted by a person skilled in the art for the mask plate in the fine metal mask process in practical work applications, and structures of the referred fine metal mask plates are the same. Taking that the plurality of mask strips (FMM sheets) are arranged in parallel, and two ends of each mask strip (FMM sheet) are welded onto a mask plate frame to form a mask frame assembly (MFA) as an example, detailed descriptions are given in the following description of the embodiments of the present disclosure.

When an evaporation process is performed in the related art, the plurality of fine metal mask plates in a tensioned and stretched state are welded onto the frame, so as to form the mask frame assembly. The mask frame assembly is placed and used in an evaporation machine. Generally, a thickness of the fine metal mask plate merely ranges from 20 μm to 100 μm, which is a great challenge for the tensioning process of the mask plate. Along with an increasing size of an electronic product such as a mobile phone and a tablet computer, a width of the fine metal mask plates needs to be increased, so as to completely cover a valid light-emitting area of the product. However, when the width of the fine metal mask plate is increased, two skirts are arranged at two ends of the fine metal mask plate. In the tensioning process, the two skirts are clamped in the tensioning device and a tensioning force is applied to the two skirts, such phenomena as prone to wrinkle, increasing sagging amount may occur, thereby to lower the tensioning precision and the welding quality, and increase the difficulty in the tensioning process.

In view of the above problems, a fine metal mask plate, a mask device and a tensioning device are provided in the present disclosure, so as to reduce the generation of wrinkles and sagging amount in the tensioning process of the mask plate and increase the tensioning precision.

Figure 1:
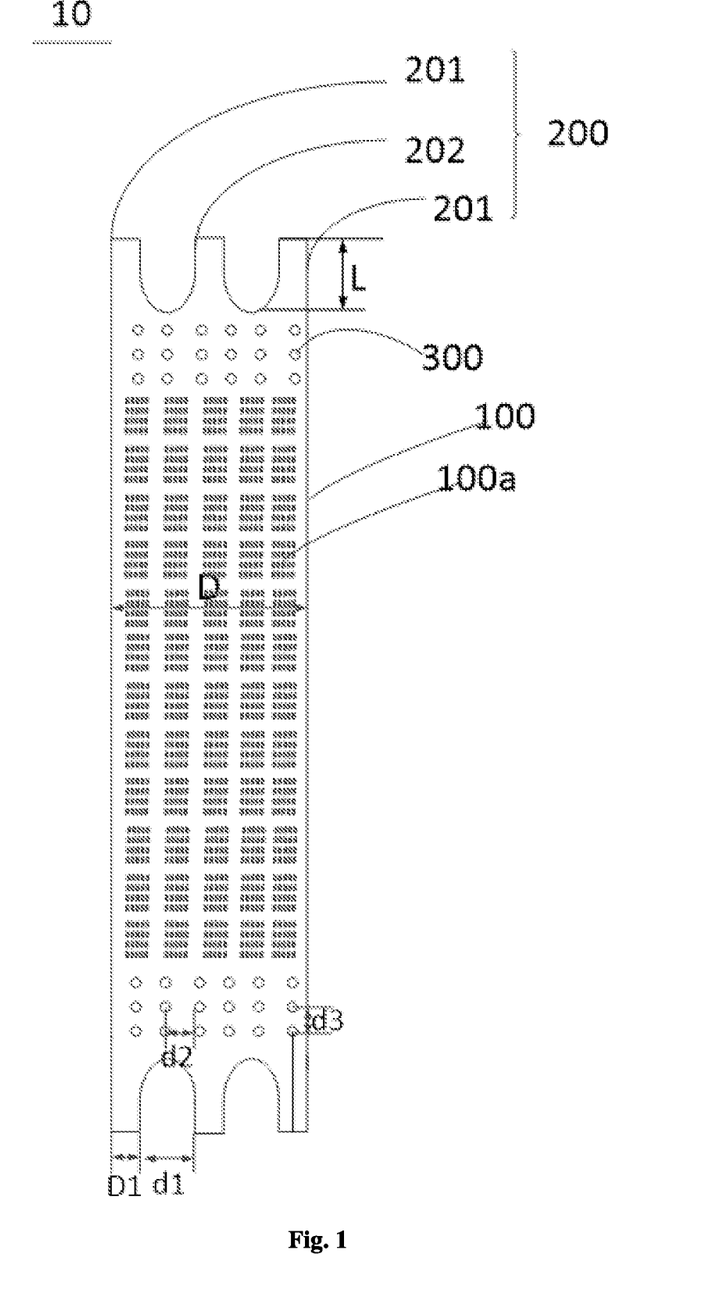
FIG. 1 is a schematic structural view showing a mask strip of a fine metal mask plate according to an embodiment of the present disclosure.
Figure 2:
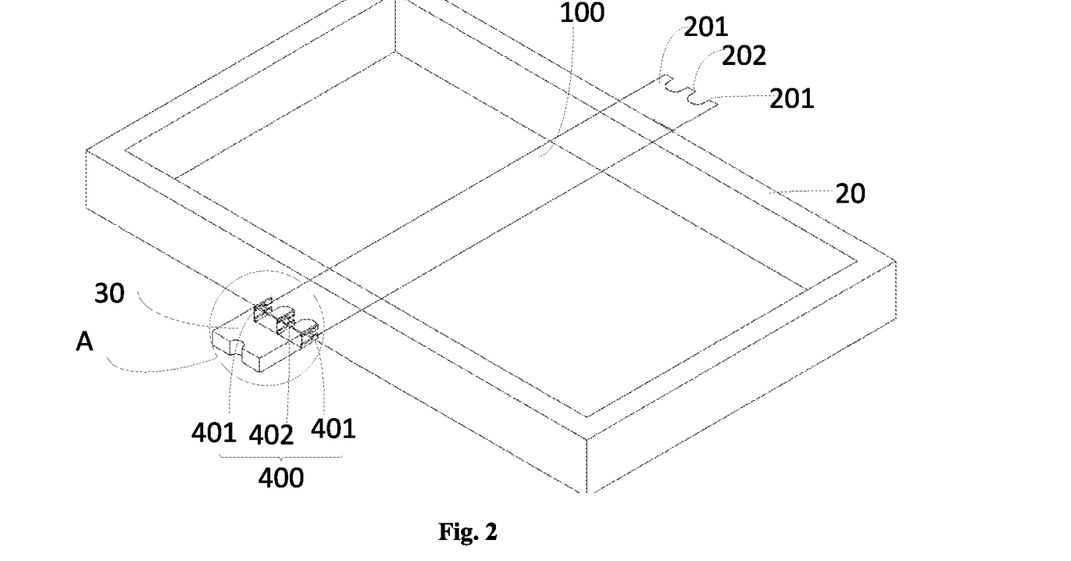
FIG. 2 is a schematic view showing the mask strip of the fine metal mask plate when a tension is applied thereto, where only grippers at one end of the mask strip is shown.

As shown in FIGS. 1 and 2, the fine metal mask plate includes a mask strip body 100 being of a strip-like shape and including two opposite long edges and two opposite short edges, and at least three skirts 200 arranged on each short edge and spaced apart from each other along an extension direction of the short edge.

The fine metal mask plate is a mask strip 10, at least three skirts 200 are arranged at two ends of the mask strip 10 (i.e., the two short edges of the mask strip body 100). As compared with a case where two skirts 200 are arranged at two ends of the mask strip 10 in the related art, when the number of the skirts 200 on the mask strip 10 is increased, a width of the mask strip 10 may be correspondingly increased, so as to be applied in manufacturing an electronic product such as a large-size mobile phone and tablet. In addition, the at least three skirts 200 are arranged at the two ends of each mask strip 10, as compared with case where two skirts 200 are arranged at two ends of the mask strip 10 in the related art, when a tensioning process of the mask plate is performed, at least two end-part skirts 201 located at the two end-part positions of the short edge among the three skirts 200 may be clamped by the tensioning device, so as to apply a tensioning force to the two end-part skirts 201 (accordingly, the two end-part skirts 201 may also be referred to as tensioning skirts or stretching skirts), while a middle skirt 202 located in the middle of the short edge may not be clamped, and merely serves as a platform for supporting the mask strip (thus, the middle skirt 202 may also be referred to as a supporting skirt). Thus, the mask plate may be freely deformed under the tensioning force, and the generation of wrinkles is reduced. Further, due to a certain supporting effect on the middle part of the mask plate, the sagging amount is reduced, and the tensioning precision is improved.

In an illustrative embodiment of the present disclosure, a width D of the mask strip body 100 in an extension direction of the short edge ranges from 100 mm to 400 mm.

In the fine metal mask plate of the embodiment of the present disclosure, at least three skirts 200 are arranged at two ends of the mask strip body 100, so that the width D of the mask strip body 100 may reach 100 mm to 400 mm, thereby to meet requirements on various display products with large and small sizes.

It should be appreciated that the width of the mask strip body 100 is not limited thereto in practical application. In order to reduce the generation of wrinkles and the sagging amount, at least three skirts 200 may also be arranged at two ends of a mask strip body 100 having a width smaller than the above width.

In an illustrative embodiment of the present disclosure, the number of the skirts 200 on each short edge is three, a width D1 of each skirt 200 in the extension direction of the short edge ranges from 10 mm to 80 mm, and the widths of the skirts in the extension direction of the short edge are the same.

When the width D of the mask strip body 100 ranges from 100 mm to 400 mm, and the number of the skirts 200 on the mask strip body 100 may be three, the width D1 of each skirt 200 ranges from 10 mm to 80 mm, and the widths of the skirts in the extension direction of the short edge are the same. Of course, it should be appreciated that an illustrative structure of the fine metal mask is merely provided hereinabove and the present disclosure is not limited thereto in practical application.

In an illustrative embodiment of the present disclosure, a spacing d1 between two adjacent skirts 200 in the extension direction of the short edge ranges from 20 mm to 80 mm, and the spacings between any two adjacent skirts in the extension direction of the short edge are the same.

When the width of the mask strip body 100 ranges from 100 mm to 400 mm, the spacing d1 between two adjacent skirts 200 in the extension direction of the short edge ranges from 20 mm to 80 mm, and the spacings between any two adjacent skirts in the extension direction of the short edge are the same. Of course, it should be appreciated that as an illustrative structure is merely provided hereinabove and the present disclosure is not limited thereto in practical application.

In an illustrative embodiment of the present disclosure, as shown in FIG. 1, the mask strip body 100 includes an opening evaporation area and welding areas, the opening evaporation area is located in a middle area of the mask strip body, and the welding areas are located at two opposite ends of the opening evaporation area and close to end parts. A plurality of welding spots 300 are arranged in the welding area, the welding spots 300 are arranged in a plurality of rows, for example, 2 rows to 5 rows, an arrangement direction of each row of welding spots 300 is an extension direction of each long edge. A spacing d2 between two adjacent rows of welding spots 300 in the extension direction of the short edge ranges from 1 mm to 5 mm, and a spacing d3 between two adjacent welding spots in a same row in the extension direction of the long edge ranges from 1 mm to 5 mm. Due to the fact that the width of the mask strip body 100 is increased, the spacing between the welding spots 300 and arrangement of the welding spots 300 may be set according the above scheme, which is beneficial for welding stability. It should be appreciated that the width of the mask strip body 100 of the fine metal mask plate in the present disclosure is larger, so that the number of the welding spots 300 and the spacing between the welding spots 300 may be adjusted according to requirements of different products.

In an illustrative embodiment, as shown in FIG. 1, the at least three skirts on each short edge of the mask strip body 100 include two end-part skirts 201 located at the end-part positions of the short edge, and a middle skirt 202 arranged between the two end-part skirts 201.

Each skirt includes a first side edge, a second side edge, a third side edge, and a fourth side edge. The first side edge and the second side edge are arranged opposite to each other, extension directions of the first side edge and the second side edge are parallel to the extension direction of the short edge, and the first side edge is connected to the short edge of the mask strip body; the third side edge and the fourth side edge are arranged opposite to each other and located between the first side edge and the second side edge;

The third side edge of one end-part skirt of the two end-part skirts is of a straight-line-like shape parallel to the extension direction of the long edge and coincides with the long edge on one side where the one end-part skirt is located, the fourth side edge of the one end-part skirt is of an arc-like shape at one end close to the first side edge, and is of a straight-line-like shape parallel to the extension direction of the long edge at one end close to the second side edge.

The fourth side edge of the other end-part skirt of the two end-part skirts is of a straight-line-like shape parallel to the extension direction of the long edge and coincides with the long edge on one side where the other end-part skirt is located, the third side edge of the other end-part skirt is of an arc-like shape at one end close to the first side edge, and is of a straight-line-like shape parallel to the extension direction of the long edge at one end close to the second side edge.

The third side edge and the fourth side edge of the middle skirt are each of an arc-like shape at one end close to the first side edge, and are each of a straight-line-like shape parallel to the extension direction of the long edge at one end close to the second side edge.

For example, when the mask strip 10 is in an orientation as shown in FIG. 1, the third and fourth side edges of the middle skirt 202 are left and right side edges of the middle skirt 202 respectively, the second side edge of the middle skirt 202 is a top edge or an edge, where a free end is located, of the middle skirt 202, and the first side edge of the middle skirt 202 is a bottom edge of the middle skirt 202, i.e., an edge adjacent to the welding area. Orientations of the first side edge, the second side edge, the third side edge and the fourth side edge of the end-part skirt are the same.

The two adjacent skirts 200 are spaced apart from each other, and an gap formed by the spacing between the two adjacent skirts 200 is shaped like a Chinese character "几" and is in the shape of a smooth transition curve, so it is able to solve such problems as wrinkling, stress concentration occurring at a groove during tensioning.

Optionally, as shown in FIG. 1, shapes of the third side edge and the fourth side edge of the middle skirt are symmetrical about a center line of the middle skirt in the extension direction of the long edge; and, an overall shape of the middle skirt and the two end-part skirts 201 among the at least three skirts on each short edge are symmetrical about a center line of the mask strip body 100 in the extension direction of the long edge.

The at least three skirts on each short edge are symmetrical in structure, so that a uniform force may be applied in the case that a force is applied.

In addition, as shown in FIG. 1, the first side edge of the skirt is connected to the mask strip body 100, so as to form an integral structure, and a length L of the skirt in a length direction of the mask strip body ranges from 20 mm to 100 mm.

In an illustrative embodiment, as shown in FIG. 1, the mask strip body includes the opening evaporation area and the welding areas. The opening evaporation area is located in the middle area of the mask strip body, the welding areas are located at two opposite ends of the opening evaporation area and close to the end-part positions. The opening evaporation area is provided with a plurality of sub-areas, and a plurality of openings 100a arranged in an array form are provided in each sub-area. Each sub-area corresponds to a single screen area on a substrate to be evaporated, and a film-forming material is deposited on a corresponding unshielded color sub-pixel unit through each opening 100a during evaporation or ink-jet printing, so as to form a corresponding pattern as a main material of a light-emitting layer (EML).

In addition, a mask device is further provided in the embodiment of the present disclosure, including: a plurality of above-mentioned fine metal mask plates, a supporting frame, and a mask plate frame 20 including a first frame and a second frame arranged opposite to each other, and a third frame and a fourth frame arranged opposite to each other. The plurality of fine metal mask plates are arranged one after another along an extension direction of the first frame, the two short edges of each fine metal mask plate are fixed onto the first frame and the second frame respectively, and the supporting frame is fixed onto the mask plate frame and arranged at one side of the fine metal mask plate.

It should be appreciated that the supporting frame may include a plurality of supporting strips and a plurality of shielding strips crossing the supporting strips, or the supporting frame may be of a mesh-like structure formed integrally. The present disclosure is not limited thereto.

FIG. 2 is a schematic view showing the mask strip of the fine metal mask plate when a tension is applied thereto, where only grippers at one end of the mask strip is shown.

Figure 3:
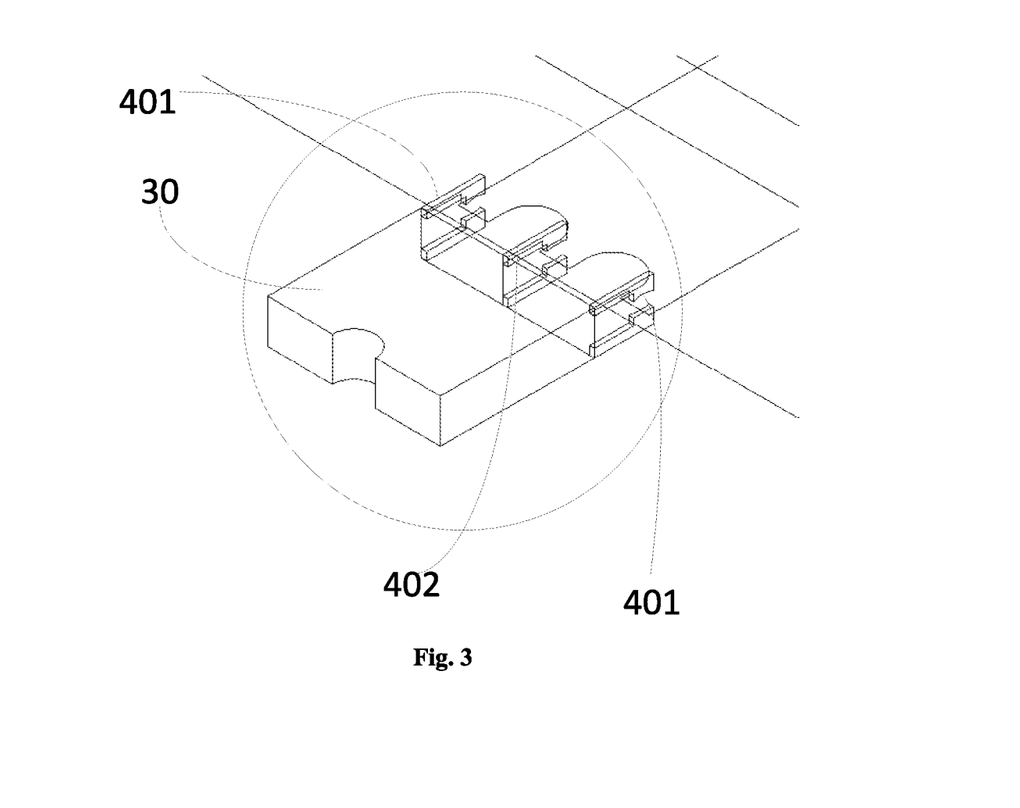
FIG. 3 is a partially enlarged view showing a structure in a circle A in FIG. 2.

As shown in FIGS. 2 and 3, a tensioning device for fixing the above-mentioned fine metal mask plate onto the mask plate frame 20 is further provided in the embodiment of the present disclosure. The tensioning device includes: two clamps 30 configured to clamp the two short edges of the mask strip body 100 respectively, and a tension control mechanism configured to control each clamp 30 to apply a tensioning force to the mask strip body 100.

Specifically, each clamp 30 includes at least three grippers 400, and each gripper 400 configured to correspond to one of the skirts 200 on the short edge and capable of engaging the corresponding skirt. The at least three skirts 200 on each short edge of the mask strip body 100 include two end-part skirts 201 arranged at the end-part positions of the short edge, and a middle skirt 202 located between the two end-part skirts 201, and the at least three grippers 400 of each clamp 30 include end-part grippers 401 corresponding to the end-part skirts 201 and a middle gripper 402 corresponding to the middle skirt 202.

In each mask strip 10 of the fine metal mask plate, at least three skirts 200 are arranged at two ends of each mask strip 10 (i.e., the two short edges of the mask strip body 100). As compared with case where two skirts 200 are arranged at two ends of the mask strip 10 in the related art, when the number of the skirts 200 on the mask strip 10 is increased, the width of the mask strip 10 may be correspondingly increased, so as to be applied in manufacturing an electronic product such as a large-size mobile phone and tablet. In addition, at least three skirts 200 are arranged at two ends of each mask strip 10, and three corresponding grippers 400 are arranged on the tensioning device to engage the skirts 200, thereby to apply the tensioning force to the mask strip 10.

During a tensioning process of a fine metal mask plate in a conventional electronic product, grippers of the tensioning device may firstly engage all skirts on the mask strip, and then tensioning is performed during which a mask plate is ensured not to be wrinkled. In the case that the conventional tensioning process where all skirts are engaged and then tensioning is performed is adopted for the fine metal mask plate in the embodiment of the present disclosure, larger wrinkles may be generated, and the difficulty in tensioning adjustment may be increased.

Accordingly, in an illustrative embodiment of the present disclosure, as shown in FIG. 2, each gripper 400 includes an upper engagement part and a lower engagement part, a clamping distance between the upper engagement part and the lower engagement part in a thickness direction of the mask strip body and for accommodating the corresponding skirt 200 is provided, and the gripper is provided with an adjustment structure configured to adjust the clamping distance. The clamping distance in the middle gripper 402 is larger than that in each end-part gripper 401, and the clamping distance in the end-part gripper 401 is smaller than or equal to a thickness of the end-part skirt 201, so as to engage the end-part skirt 201. The clamping distance in the middle gripper 402 is larger than a thickness of the middle skirt 202, so that the middle gripper 402 is not engaged with the middle skirt 202.

During the tensioning process of the fine metal mask plate, among the at least three grippers 400 in the tensioning device, the two end-part grippers 401 corresponding to the two end-part positions of the short edge are engaged with corresponding end-part skirts 201, so as to apply the tensioning force to the two end-part skirts 201, while the middle gripper 402 located in the middle of the short edge may not be engaged with the middle skirt 202, and merely serves as a platform for supporting the mask strip 10 (thus, the middle skirt 202 may also be referred to as a supporting skirt). Thus, the mask plate may be freely deformed under the tensioning force, and the generation of wrinkles is reduced. Further, due to a certain supporting effect on the middle part of the mask plate, the sagging amount is reduced, and the tensioning precision is improved.

In an illustrative embodiment, the tension control mechanism includes: a tension applying structure connected to the grippers 400 and configured to control the end-part gripper 401 to apply a tensioning force to the end-part skirt 201, a detector configured to acquire an offset between a current position of the fine metal mask plate and a target position, and a controller configured to adjust the tensioning force applied by the end-part gripper 401 to the end-part skirt 201 in accordance with the offset.

In this way, the offset between the current position of the fine metal mask plate and the target position may be acquired by the detector, and the tensioning force applied to each skirt 200 at two end-part positions of the mask strip may be adjusted by the controller in accordance with the offset.

It should be appreciated that a direction of the tensioning force applied by the tension applying structure to the end-part skirt 201 is parallel to the length direction of the mask strip body and is a direction of pulling toward the outside of the mask strip body.

In addition, the tension control mechanism may further include a gripper controller connected to the adjustment structure and configured to control the adjustment structure to adjust the clamping distance in each gripper. The controller is further configured to control the gripper controller in accordance with preset parameters, so that a corresponding clamping gap is provided in each gripper.

In this way, the clamping distances in the grippers may be automatically adjusted through the tension control mechanism. The preset parameters may be pre-stored in the controller, and the clamping distances in the grippers are controlled according to the preset parameters. For example, the clamping distance in the end-part gripper is controlled to be smaller than or equal to the thickness of the end-part skirt, so that the end-part gripper may be engaged with the end-part skirt. The clamping distance in the middle gripper is controlled to be larger than the thickness of the middle skirt, so that the middle gripper is not engaged with the middle skirt. For example, the clamping distance in the middle gripper may be larger than the thickness of the middle skirt by about 1 mm.

It should be appreciated that the adjustment structure may adjust the distance between the upper and lower engagement parts, and may adjust the clamping distance in the grippers in various ways, which is not defined herein.

A specific method of performing tensioning on the fine metal mask plate by the tensioning device in the embodiment of the present disclosure is described hereinafter.

First, rough alignment is performed on the mask strip, and pre-stretching is started after ensuring that clamping positions of the grippers 400 are correct. FIG. 3 is an enlarged view showing a clamping area between the skirts 200 and the grippers 400. At this time, the middle gripper 402 corresponding to the middle skirt 202 merely serves as a platform for supporting the mask plate, and does not need to be engaged with the middle skirt 202 of the mask plate. Thus, the mask plate 10 may be freely deformed under the tensioning force, and the generation of wrinkles is reduced. Further, due to a certain supporting effect on the mask plate 10, and the sagging amount is reduced. A preset tensioning force value, such as a half of a target tensioning force value, may be pre-applied to the two end-part grippers 401 during the tensioning process, and then the target tensioning force value is gradually applied.

Second, precise alignment is performed on the mask strip 10 in a hole align mode, which is namely a Pattern Position Accuracy (PPA) alignment process, and the offset between the current position of the fine metal mask plate and the target position, i.e., a PPA value, is acquired by the detector. According to specifications of different products, a size of a clamping force on each gripper 400 is adjusted until the clamping force is matched with a target PPA value, during which the middle gripper 400 is not engaged with the skirt all the time, and the clamping forces on the other grippers 400 are adjusted according to detected PPA values, so as to meet the tensioning requirement.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A fine metal mask plate, comprising:
   a mask strip body being of a stripe-shaped shape and comprising two opposite long edges and two opposite short edges; and
   a number of skirts arranged on each short edge is three and spaced apart from each other along an extension direction of the short edge;
   wherein the three skirts on each short edge of the mask strip body comprise two end-part skirts arranged at end-part positions of the short edge, and a middle skirt located between the two end-part skirts;
   wherein the mask strip body comprises welding areas adjacent to the short edges; each welding area is provided with a plurality of rows of welding spots, and an arrangement direction of each row of welding spots is an extension direction of each long edge;
   wherein the welding area is provided with 2 to 5 rows of welding spots;

wherein a width of the mask strip body in the extension direction of the short edge ranges from 100 mm to 400 mm;

wherein a width of each of the three skirts in the extension direction of the short edge ranges from 10 mm to 80 mm, and the widths of the skirts in the extension direction of the short edge are the same;

each skirt of the three skirts comprises a first side edge, a second side edge, a third side edge and a fourth side edge, wherein the first side edge and the second side edge are arranged opposite to each other, extension directions of the first side edge and the second side edge are parallel to the extension direction of the short edge, and the first side edge is connected to the short edge of the mask strip body; the third side edge and the fourth side edge are arranged opposite to each other and located between the first side edge and the second side edge;

wherein the third side edge of one end-part skirt of the two end-part skirts is of a straight-line shape parallel to the extension direction of the long edge and coincides with the long edge on one side where the one end-part skirt is located, the fourth side edge of the one end-part skirt is of an arc shape at one end adjacent to the first side edge, and is of a straight-line shape parallel to the extension direction of the long edge at one end adjacent to the second side edge;

the fourth side edge of the other end-part skirt of the two end-part skirts is of a straight-line shape parallel to the extension direction of the long edge and coincides with the long edge on one side where the other end-part skirt is located, the third side edge of the other end-part skirt is of an arc shape at one end adjacent to the first side edge, and is of a straight-line shape parallel to the extension direction of the long edge at one end adjacent to the second side edge; and the third side edge and the fourth side edge of the middle skirt are each of an arc shape at one end adjacent to the first side edge, and are each of a straight-line shape parallel to the extension direction of the long edge at one end adjacent to the second side edge;

wherein edges of the third side edge and the fourth side edge of the middle skirt having the arc shape abut the welding area.

2. The fine metal mask plate according to claim 1, wherein a spacing between two adjacent skirts of the three skirts in the extension direction of the short edge ranges from 20 mm to 80 mm, and the spacings between any two adjacent skirts of the three skirts in the extension direction of the short edge are the same.

3. The fine metal mask plate according to claim 1, wherein a spacing between two adjacent rows of welding spots in the extension direction of the short edge ranges from 1 mm to 5 mm, and a spacing between two adjacent welding spots in a same row in the extension direction of the long edge ranges from 1 mm to 5 mm.

4. The fine metal mask plate according to claim 1, wherein shapes of the third side edge and the fourth side edge of the middle skirt are symmetrical about a center line of the middle skirt in the extension direction of the long edge; and an overall shape of the middle skirt and the two end-part skirts among the three skirts on each short edge are symmetrical about a center line of the mask strip body in the extension direction of the long edge.

5. The fine metal mask plate according to claim 1, wherein the mask strip body comprises an opening evaporation area and the welding areas, the opening evaporation area is located in a middle area of the mask strip body, the welding areas are located at two opposite ends of the opening evaporation area and adjacent to the short edges, the opening evaporation area is provided with a plurality of sub-areas, and a plurality of openings arranged in an array form are provided in each sub-area.

6. The fine metal mask plate according to claim 1, wherein a space between the middle skirt and each end-part skirt is of a U-shape.

7. The fine metal mask plate according to claim 1, the first side edge of each skirt is connected to the mask strip body, to form an integral structure, and a length of each skirt in a length direction of the mask strip body ranges from 20 mm to 100 mm.

8. A mask device, comprising:
a plurality of fine metal mask plates, each fine metal mask plate of the plurality of fine metal mask plates is the fine metal mask plate according to claim 1;
a supporting frame; and
a mask plate frame comprising a first frame and a second frame arranged opposite to each other, and a third frame and a fourth frame arranged opposite to each other;
wherein the plurality of fine metal mask plates are arranged one after another along an extension direction of the first frame, the two short edges of each fine metal mask plate are fixed onto the first frame and the second frame respectively, and the supporting frame is fixed onto the mask plate frame and arranged at one side of the fine metal mask plate.

9. The mask device according to claim 8, wherein a spacing between two adjacent skirts of the three skirts in the extension direction of the short edge ranges from 20 mm to 80 mm, and the spacings between any two adjacent skirts of the three skirts in the extension direction of the short edge are the same.

10. The mask device according to claim 8, wherein a spacing between two adjacent rows of welding spots in the extension direction of the short edge ranges from 1 mm to 5 mm, and a spacing between two adjacent welding spots in a same row in the extension direction of the long edge ranges from 1 mm to 5 mm.

11. The mask device according to claim 8, wherein an orthogonal projection of each skirt onto a plane where the mask plate frame is located is outside the first frame and the second frame, and orthogonal projections of welding areas onto the plane where the mask plate frame is located overlap the first frame and the second frame.

12. The mask device according to claim 8, wherein shapes of the third side edge and the fourth side edge of the middle skirt are symmetrical about a center line of the middle skirt in the extension direction of the long edge; and an overall shape of the middle skirt and the two end-part skirts of the three skirts on each short edge are symmetrical about a center line of the mask strip body in the extension direction of the long edge.

13. The mask device according to claim 8, wherein the mask strip body comprises an opening evaporation area and the welding areas, the opening evaporation area is located in a middle area of the mask strip body, the welding areas are located at two opposite ends of the opening evaporation area and adjacent to the short edges, the opening evaporation area is provided with a plurality of sub-areas, and a plurality of openings arranged in an array form are provided in each sub-area.

14. The mask device according to claim 8, wherein a space between the middle skirt and each end-part skirt is of a U-shape.

\* \* \* \* \*